(12) United States Patent
Axelrod et al.

(10) Patent No.: US 7,728,492 B2
(45) Date of Patent: Jun. 1, 2010

(54) PIEZOELECTRIC COMPOSITE MATERIAL

(75) Inventors: Noel Axelrod, Jerusalem (IL); Amir Lichtenstein, Tel Aviv (IL); Eran Ofek, Modi'in (IL); Vered Pardo-Yissar, Neve Monoson (IL)

(73) Assignee: Physical Logic AG, Zug (CH)

( * ) Notice: Subject to any disclaimer, the term of this patent is extended or adjusted under 35 U.S.C. 154(b) by 517 days.

(21) Appl. No.: 11/611,619

(22) Filed: Dec. 15, 2006

(65) Prior Publication Data

US 2007/0138905 A1 Jun. 21, 2007

Related U.S. Application Data

(60) Provisional application No. 60/751,863, filed on Dec. 19, 2005, provisional application No. 60/794,959, filed on Apr. 26, 2006.

(51) Int. Cl.
*H01L 41/08* (2006.01)

(52) U.S. Cl. .................... 310/357; 310/339; 310/800

(58) Field of Classification Search .......... 310/328, 310/330, 332, 800, 339
See application file for complete search history.

(56) References Cited

U.S. PATENT DOCUMENTS

| | | | | |
|---|---|---|---|---|
| 4,185,621 A | * | 1/1980 | Morrow | 600/485 |
| 4,868,447 A | * | 9/1989 | Lee et al. | 310/328 |
| 4,935,382 A | | 6/1990 | Johnston et al. | |
| 5,018,048 A | | 5/1991 | Shaw | |
| 5,166,573 A | * | 11/1992 | Brown | 310/334 |
| 5,499,541 A | | 3/1996 | Hopf | |
| 5,548,564 A | | 8/1996 | Smith | |
| 5,736,448 A | | 4/1998 | Saia | |
| 5,810,015 A | | 9/1998 | Flaherty | |
| 5,827,980 A | | 10/1998 | Doemens | |
| 6,056,696 A | | 5/2000 | Kallman | |
| 6,076,405 A | | 6/2000 | Schoess | |
| 6,092,269 A | | 7/2000 | Yializis | |
| 6,198,205 B1 | * | 3/2001 | Oberlin et al. | 310/339 |
| 6,218,632 B1 | | 4/2001 | McCarthy | |
| 6,252,336 B1 | * | 6/2001 | Hall | 310/339 |
| 6,532,824 B1 | | 3/2003 | Ueno | |
| 6,583,533 B2 | * | 6/2003 | Pelrine et al. | 310/309 |
| 6,890,807 B2 | | 5/2005 | Chau et al. | |

OTHER PUBLICATIONS

Philippe Dubois, Samuel Rosset, Sander Koster, Jean-Marc Buforn, Johann Stauffer, Serguei Mikhaïlov, Massoud Dadras, Nico-F. De Rooij, Herbert Shea Microactuators Based on Ion-Implanted Dielectric Electroactive Polymer Membranes, Solid-State Sensors, Actuators and Microsystems, 2005. Digest of Technical Papers. Transducers The 13th International Conference on vol. 2, Issue , Jun. 5-9, 2005 pp. 2048-2051 vol. 2.

(Continued)

*Primary Examiner*—Mark Budd
(74) *Attorney, Agent, or Firm*—Edward S. Sherman

(57) ABSTRACT

A composition of matter having multiple layers of different conductors separated by thin layers of dielectric materials has a high piezoelectric coefficient when the conductors are metals having a significant difference in work function and the dielectric materials have a low elastic modulus when the metal layers are connected to form a capacitive circuit. Alternatively, when the conductors are semi-conductors they should have a significant difference in Fermi levels.

20 Claims, 11 Drawing Sheets

OTHER PUBLICATIONS

G. Yanga, G. Yaoa, W. Rena, G. Akhrasa, J.P. Szabob and B.K. Mukherjeea "The Strain Response of Silicone Dielectric Elastomer Actuators" Proceedings of the SPIE, vol. 5759, pp. 134-143 (2005).

Wang and Song, "Piezoelectric Nanogenerators Based on Zinc Oxide Nanowire Arrays", p. 242, Science, vol. 312, Apr. 14, 2006.

V. M. Bogomol'nyi and Yu. N. Serebryakov, Measurement Techniques. vol. 39, No. J. 1996 Acoustical Measurements Calculation of an Electric Field in Metal-Insulator-Metal Structures, p. 86, conclusion.

* cited by examiner

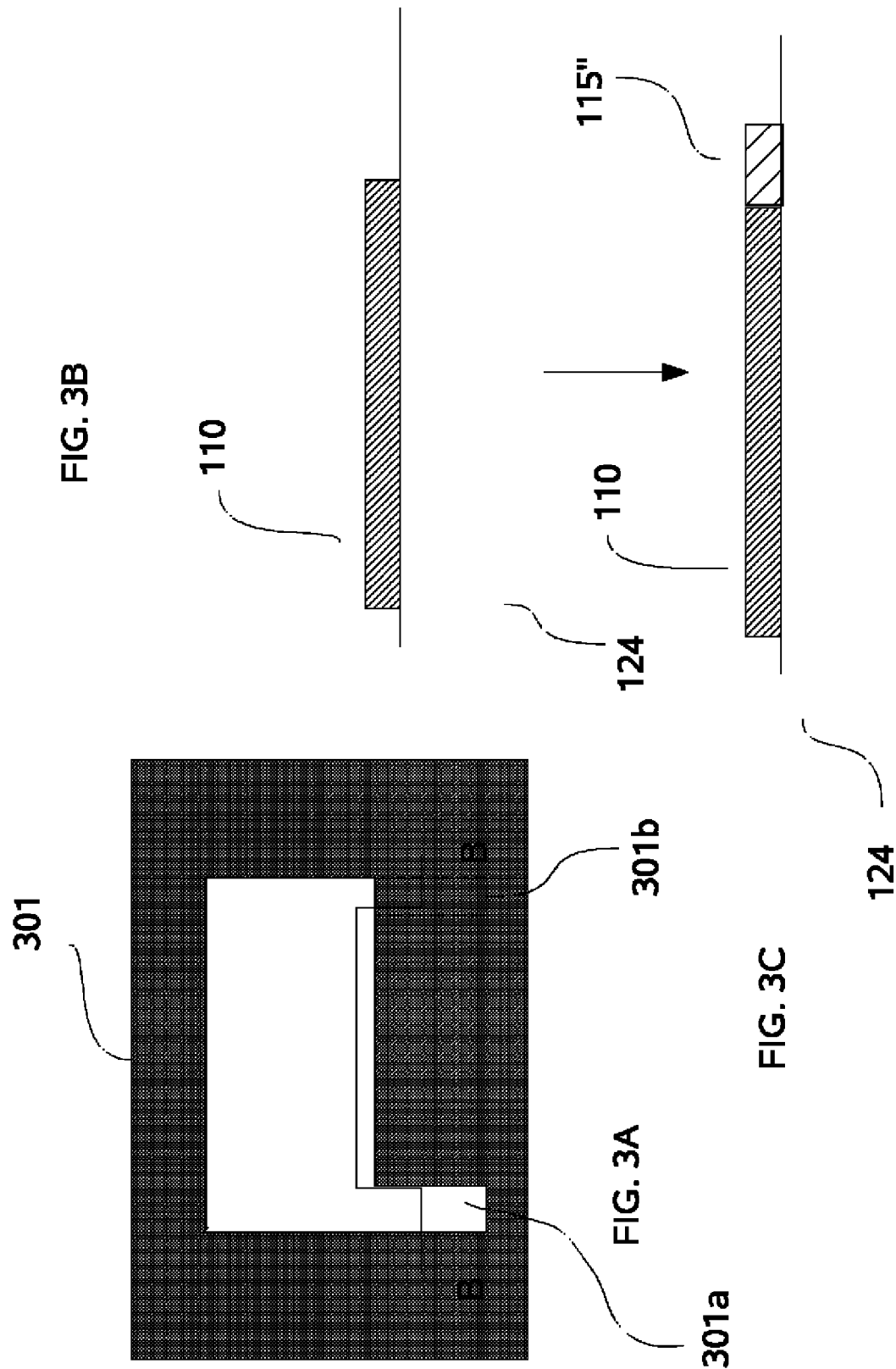

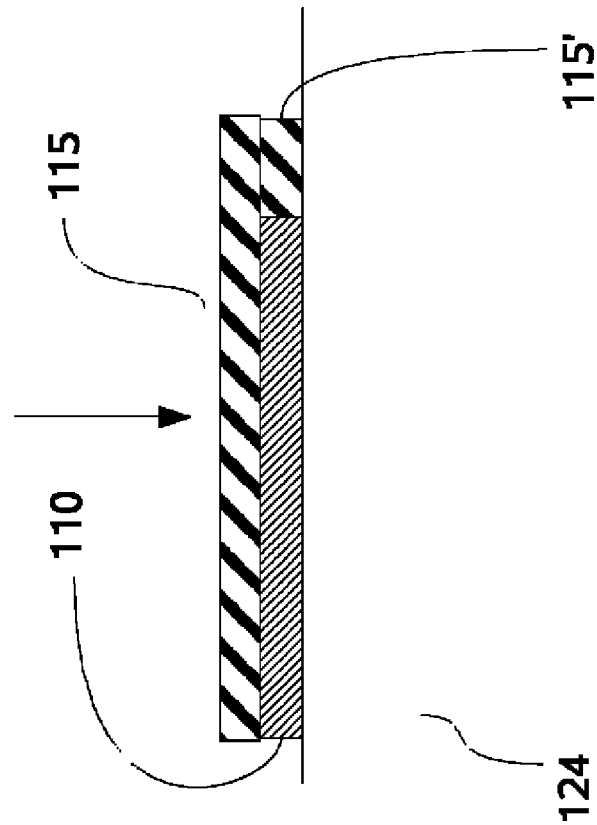
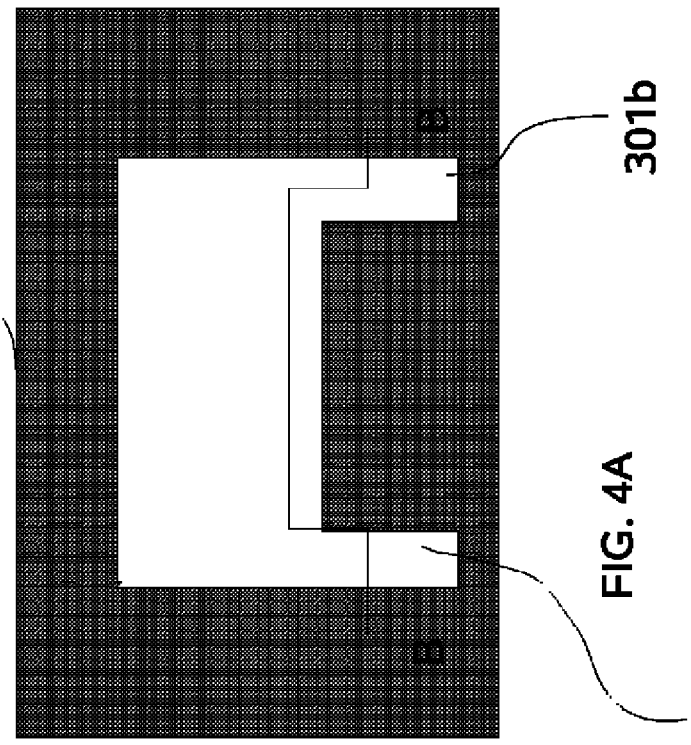
FIG. 4B
FIG. 4A
FIG. 4C

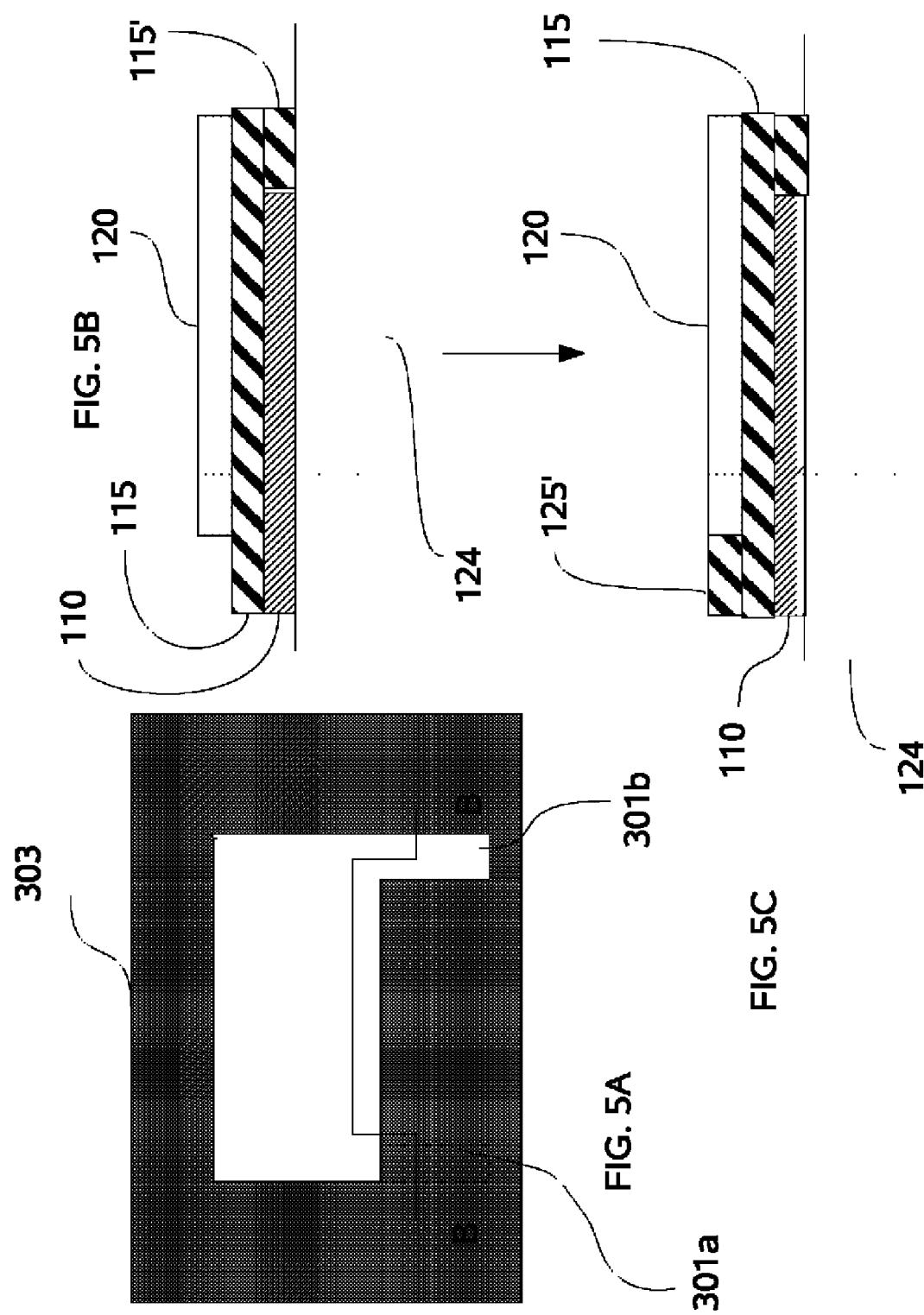

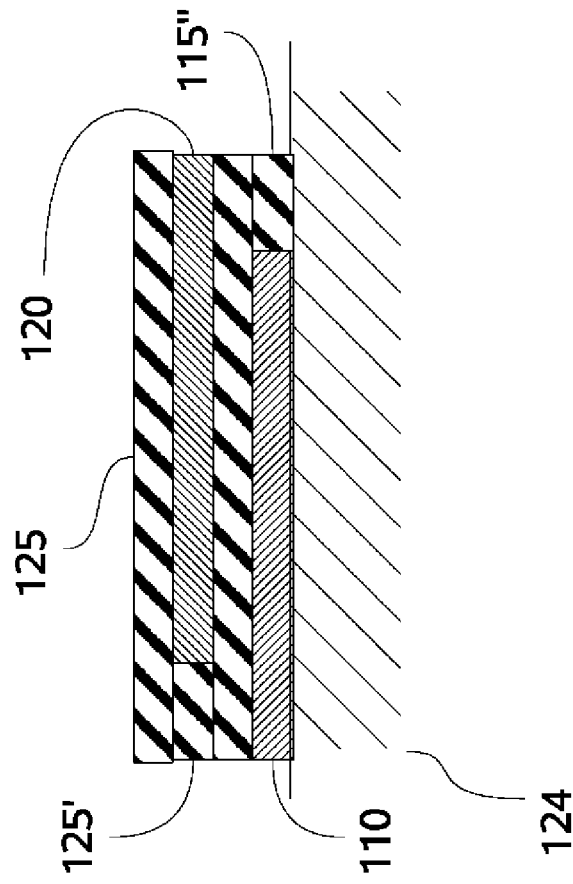
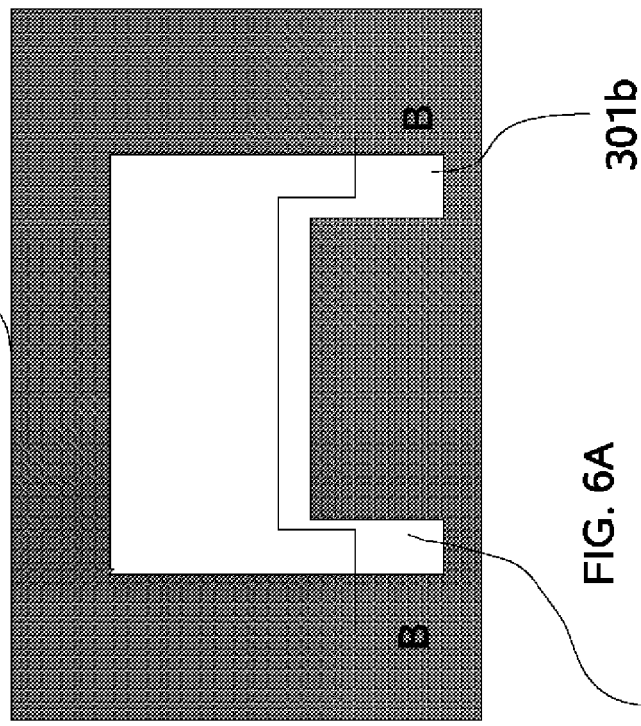

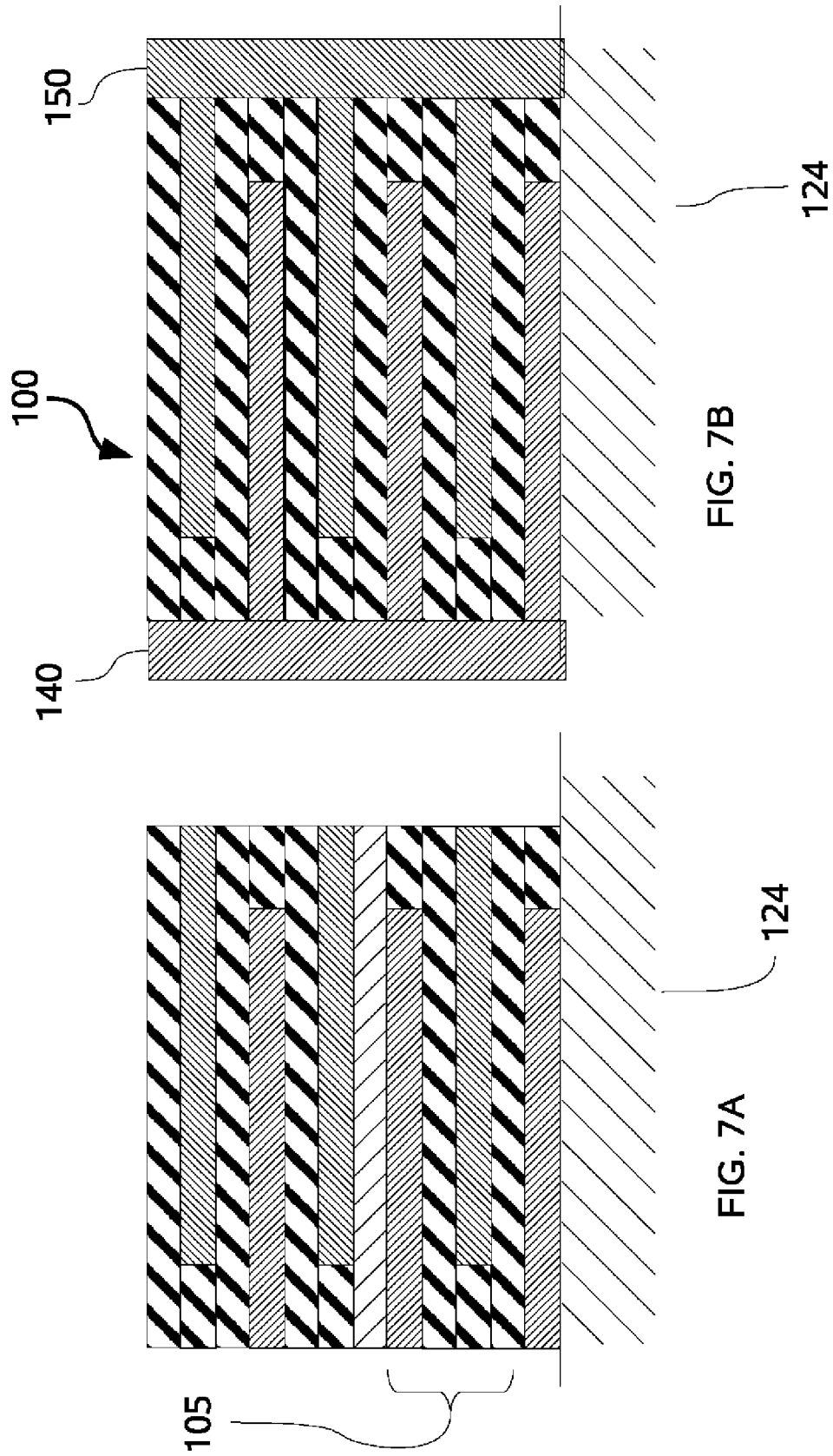

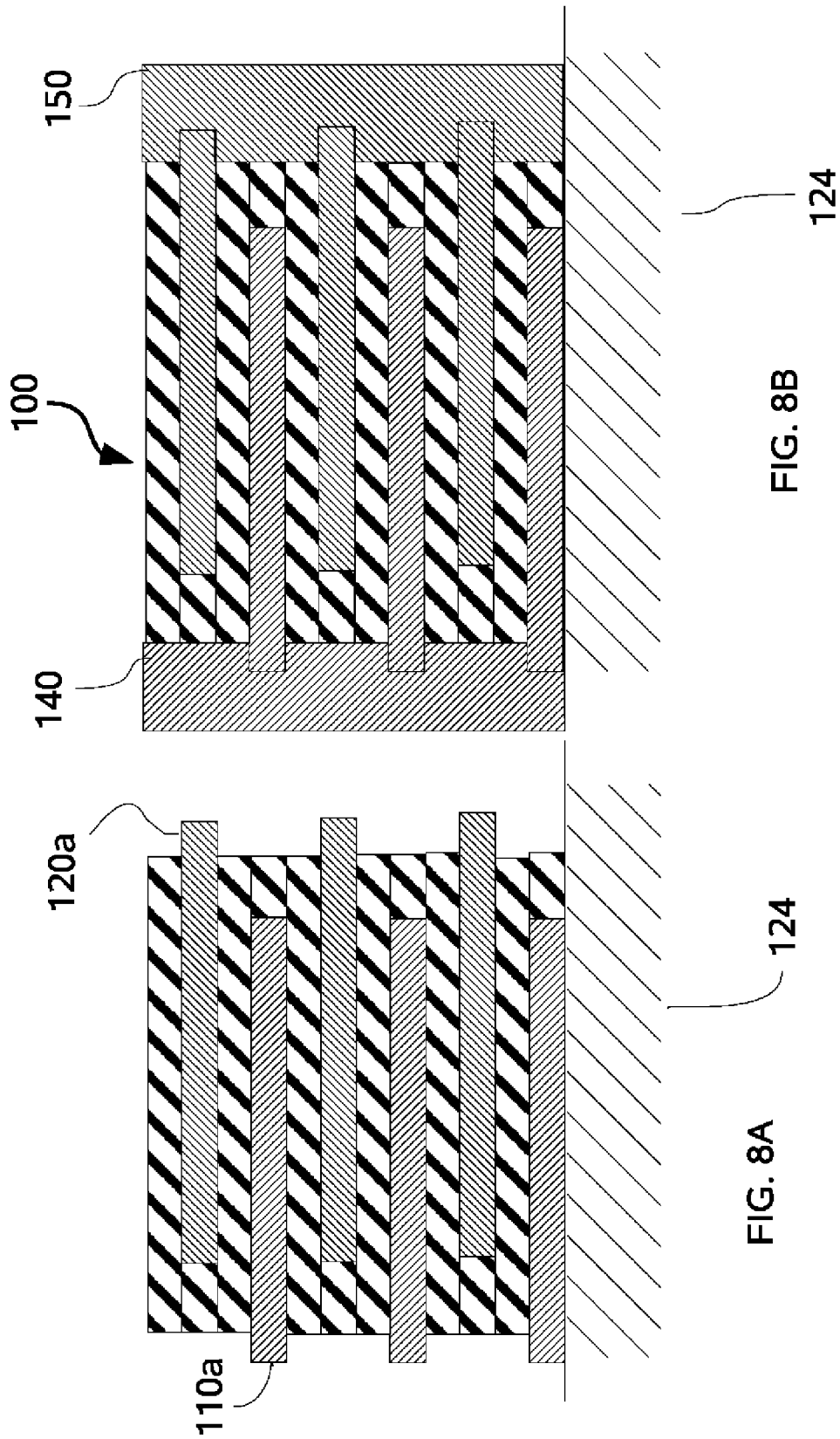

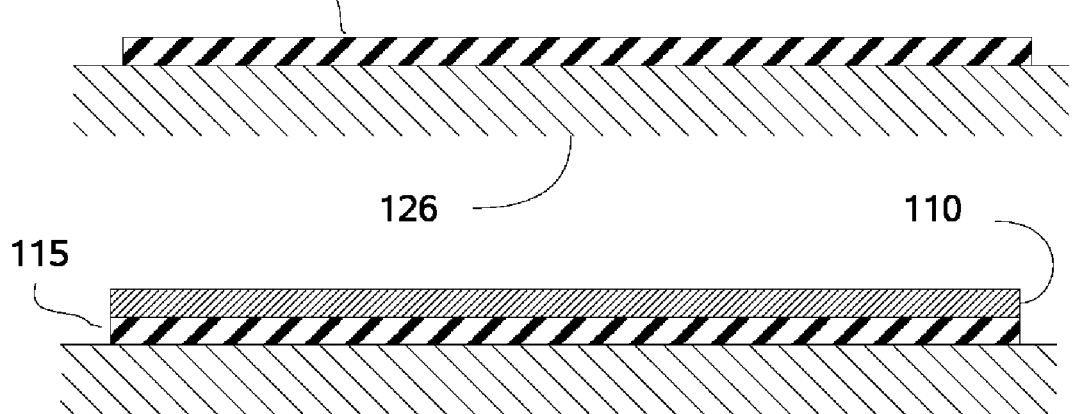
FIG. 10A
FIG. 10B
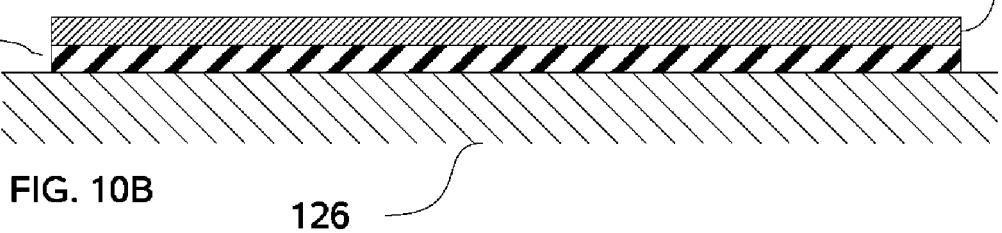
FIG. 10C
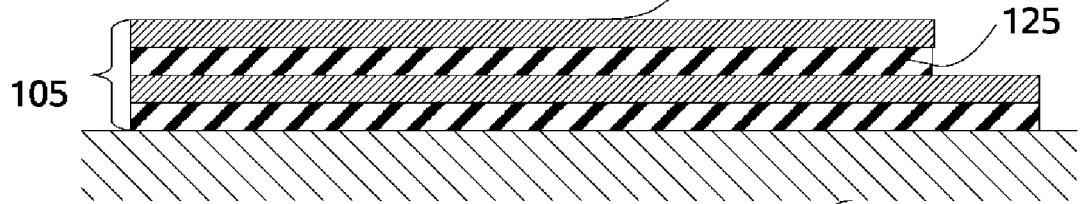
FIG. 10D
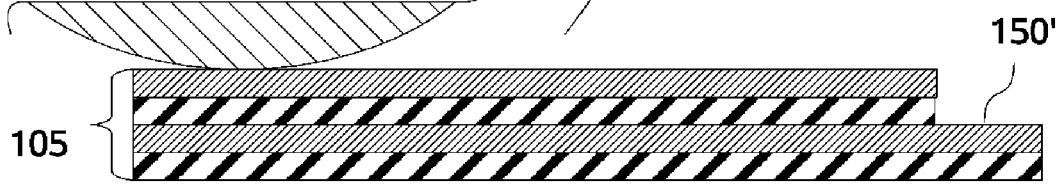
FIG. 10E

PIEZOELECTRIC COMPOSITE MATERIAL

CROSS REFERENCE TO RELATED APPLICATIONS

The present application claims priority to U.S. provisional patent application having application Ser. No. 60/751,863, entitled "Piezoelectric Composite Material", which was filed on Dec. 19, 2005, which is incorporated herein by reference. The present application also claims priority to U.S. provisional patent application having application Ser. No. 60/794,959, entitled "Method and Device for Recharging Batteries", which was filed on Feb. 26, 2006, which is also incorporated herein by reference.

BACKGROUND OF INVENTION

The present invention relates to compositions of matter that exhibit piezoelectric phenomena, and more specifically to such composites formed from conductive and/or semi-conductive materials and dielectric materials.

Piezoelectricity is an effect by which energy is converted between the mechanical and electrical forms. The general form of linear coupling between stress tensor $\sigma_J$ and polarization vector $P_i$ in direct piezoelectric effect is given by the equation $$P_i = d_{i,J}\sigma_J \tag{1}$$

where $d_{i,J}$ is the piezoelectric charge constants and indexes $i=\{1, 2, 3\}$, $J=\{1, 2, \ldots, 6\}$. For index J the Voigt notation conversion is used.

Consider a crystal of piezoelectric material 10 with an electrical axis in the z direction (FIG. 1). Mechanical compression or tension acting in parallel to the z axis on the crystal induces excess of charge density $$\Delta q = P_3 = d_{33}\sigma_3 \tag{2}$$

The conversion of mechanical forces into electric potential (charge excess) is known as direct piezoelectric effect. The inverse process of conversion of electric potential into mechanical motion is known as inverse piezoelectric effect.

Today, for micro and nano-electromechanical systems, $PbZn_{1-x}Ti_xO_3$ wherein x is about 0.48 (PZT) is widely used in the form of thin films. However, PZT films, like other ceramic materials, are extremely brittle. Further, PZT thin films exhibit a hysteresis effect. In addition, the piezoelectric coupling constancies of PZT materials are strongly temperature dependant. The nonlinear effects, parameter variations, and other phenomena and effects observed in piezotransducers make it extremely difficult to integrate the piezotransducer dynamics. In fact, the steady-state analysis does not allow one to fully examine the system performance and make a conclusion based on requirements and specifications imposed.

It is therefore a first object of the present invention to provide piezoelectric materials for transducers, sensors and other applications that have a high piezoelectric coefficient yet are not brittle.

It is a further object of the invention to provide such piezoelectric materials in the form of thin films for ease of integration with micro electrical mechanical systems (MEMS) or nano-electrical mechanical systems (NEMS).

SUMMARY OF INVENTION

In the present invention, the first object of providing a composition of matter with a high piezoelectric coefficient is achieved by forming a material having a series of layers having a periodic layered structure that itself comprises a first conductive material, a dielectric material, a second conductive material with a different work function/Fermi level from the first conductive material, followed by another layer of dielectric material. All the first conductive layers connect to a common first terminal. All the second conductive layers connect to a second common second terminal.

As the preferred form of the dielectric materials is an organic insulator, and more preferably a polymeric material, the composition is not brittle. Further, as the composition comprises multiple thin film layers it is amenable to incorporation of MEMS devices and integrated sensors.

The novel composite material is capable of use in MEMS (and larger), NEMS or other integrated devices to provide a power source by converting either single or periodic mechanical motion into electric power. Such miniature power supplies may be implanted in humans and animals for example to power various forms of implanted and leadless medical devices, including in-vivo monitoring of physiological functions.

The above and other objects, effects, features, and advantages of the present invention will become more apparent from the following description of the embodiments thereof taken in conjunction with the accompanying drawings.

BRIEF DESCRIPTION OF DRAWINGS

FIG. 3A is a plan view of mask used in a first step in fabricating piezoelectric material 100. FIG. 3B is a cross-sectional elevation along staggered section line B-B in FIG. 3A after deposition of the first metal layer 110 on a substrate or first dielectric layer 125. FIG. 3C is a cross-sectional elevation along staggered section line B-B in FIG. 3A

FIG. 4 illustrates another mask (A) in the process continuing from FIG. 3, along with a representative cross-sectional elevation at this stage (B).

FIG. 5 illustrates another mask (A) in the process continuing from FIG. 4B, along with a representative cross-sectional elevations at these stages (B, C).

FIG. 6 illustrates another mask (A) in the process continuing from FIG. 5C, along with a representative cross-sectional elevation at this stage (B).

FIG. 7A is a cross-sectional elevation illustrating the results of repeated applications of the steps shown in FIG. 3-6, whereas FIG. 7B illustrates in cross-section the result of one embodiment of one or more additional steps of connecting alternating conductive layers to electrodes.

FIGS. 8 A and B illustrate in cross-sectional elevations an alternative embodiment of a process of additional steps for connecting alternating conductive layers to electrodes.

FIG. 10 illustrates a sequence of fabrication steps in an alternative embodiment.

DETAILED DESCRIPTION

Figure 1:
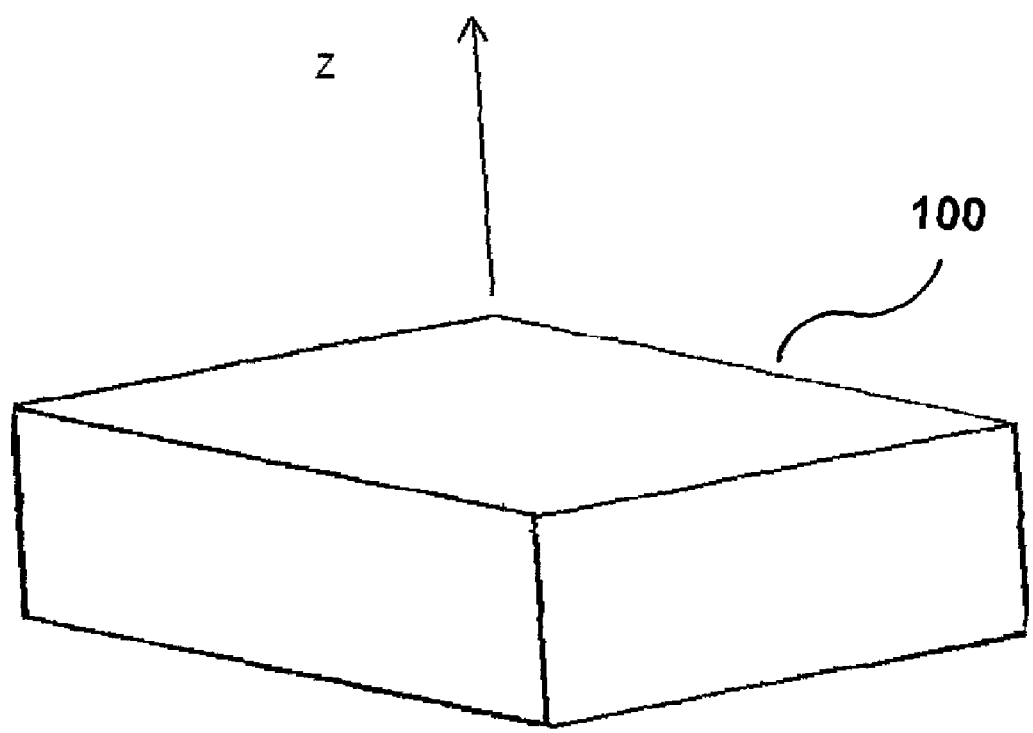
FIG. 1 is a schematic diagram of a piezoelectric material showing the direction of applied stress.

Referring to FIGS. 1 through 11, wherein like reference numerals refer to like components in the various views, there is illustrated therein a new and improved piezoelectric material, generally denominated 100 herein.

Figure 2:
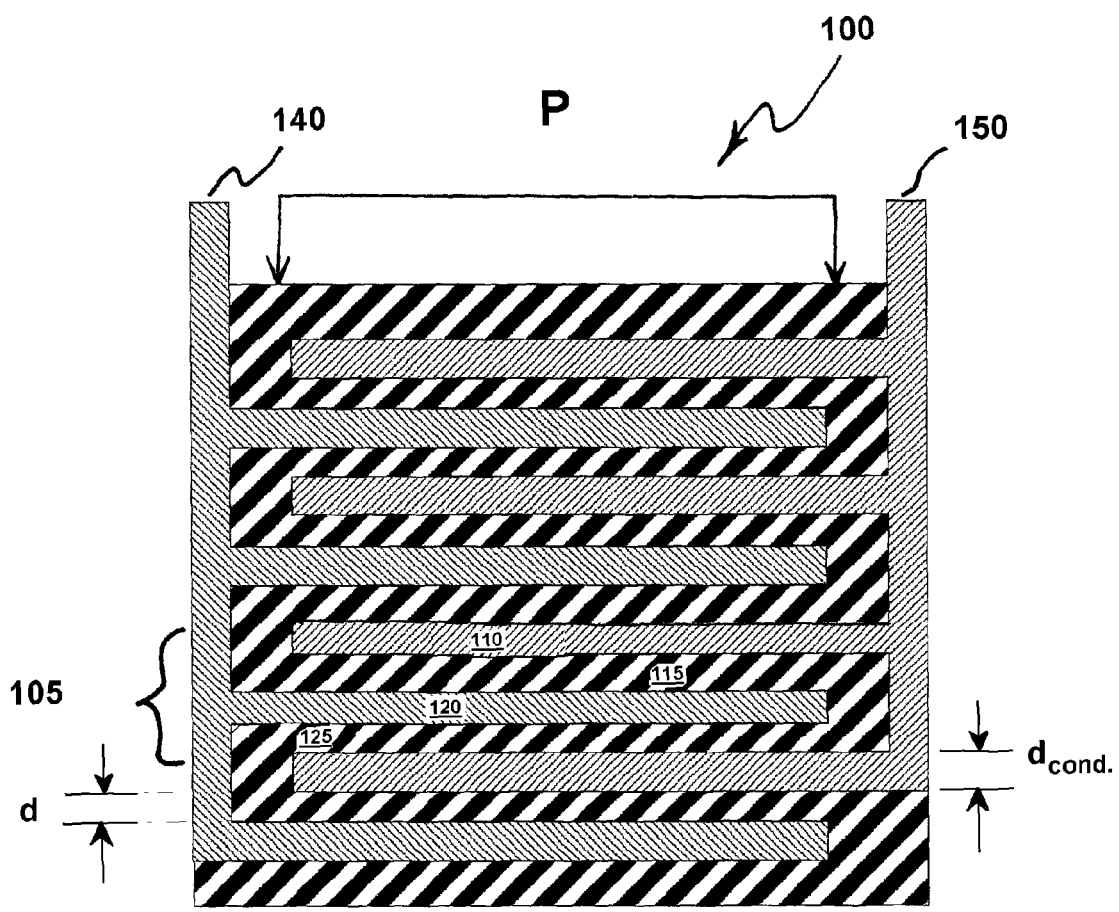
FIG. 2 is a schematic cross section through a portion of a device deploying the novel composition of matter.

In accordance with one embodiment of the present invention piezoelectric material 100, as shown in FIG. 2 comprises a plurality of repeating units 105 having the layered structure of first a conductive layer 110, a dielectric 115, a $2^{nd}$ conductive layer 120 and another layer of dielectric 125. The first and second conductive layers are optionally metals or semi-conductors (organic and/or inorganic), including doped semiconductors. When the first and second conductive materials are metals they each have a different work function. When the different conductive materials are semi-conductors they each have a different Fermi level. Conductive layers have thickness $d_{cond}$ and layers of dielectric materials have thickness d. As shown in FIG. 2, all first conductive layers 110 connect to a common first terminal 150. Further, all second conductive layers 120 connect to a second common second terminal 140. The device can be viewed as a system of N−1 capacitors connected in parallel, where N is the number of conductive plates. However, as each repeat unit 105 has two conductive layers N is 2 times the number of repeat units.

In other embodiments of the invention, which include methods of using the composite material, the first and second conductive layers need not be different metals or semi-conductors or have the same work function/Fermi level. Further, the term metal is intended to encompass alloys, inter-metallic compounds, as well as metal, alloys and compounds having sub-stoichiometric quantities of oxygen, nitrogen, carbon and the like, or much thinner layers of sub-oxides, nitrides or carbides that may not themselves be conductive.

Generally, the composition illustrated in FIG. 2 consists from equally spaced layers of conductive and dielectric materials. Further, the dielectric material is preferably an organic insulating material, such as an organic polymer, as will be better appreciated from the operative principles discussed below. The preferred values of d are expected to be in the range from 2 nm to 1000 nm.

Not wishing to be bound by theory, the following considerations are offered to explain the fundamental source of piezoelectric properties in the composition shown in FIG. 2. If $W_a$ is a work function of the metal in the first conductive layer 110 and $W_b$ is the work function of the metal in the second conductive layer 120, then the potential difference between two neighboring electrodes is $\phi=(W_b-W_a)/e$. This is known as the contact potential. The electric field in the insulator layer is $\phi/d$. This field could be extremely high for a thin insulator layer. For example, for $\phi=1$ Volt and $d=10$ nm the magnitude of the field is $10^7$ V/m. As many insulator materials exhibit dielectric breakdown at such a high field, an insulating layer should be selected from a group of materials with a dielectric breakdown above that value, which includes of organic materials such as oils, lipids, polymers, elastomers, paper and the like. It should be appreciated that when the first and/or second conductive layers are semi-conductors, the Fermi level can be substituted for the work function when calculating the contact potential in the above equation.

When a pressure P is applied to the top of the devise in FIG. 2, parallel to the z axis, the applied pressure induces stress $\sigma_3=P$ in the dielectric layers between the electrodes. As a result of the strain, the dielectric film is compressed. The corresponding change of the capacitance density (capacitance per surface area) is $$\Delta C = -N\frac{\varepsilon_0 \varepsilon}{d^2}\Delta d, \quad (3)$$

where N is the number of the dielectric layers and $\in$ is the dielectric permittivity of insulator material. Using the equation below $$\frac{\Delta d}{d} = u_3 = \frac{\sigma_3}{E}, \quad (4)$$

where $u_3$ is the strain, $\sigma_3$ is the stress in the insulator layer and E is the stiffness (Young's module) of the insulating material. Eq. (3) can be rewritten to express the change in capacitance as a function of the stress and elastic modulus as:

$$\Delta C = -N\frac{\varepsilon_0 \varepsilon}{Ed}\sigma_3, \quad (5)$$

The charge density excess on the electrodes due to applied pressure is then:

$$\Delta q = \Delta C\varphi = -N\frac{\varepsilon_0 \varepsilon \varphi}{Ed}\sigma_3 \quad (6)$$

Thus, combining the above result with the general expression for the piezoelectric phenomena from Eq. (2) results in the piezoelectric material 100 having a the piezoelectric charge constant $d_{33}$ of:

$$d_{33} = -N\frac{\varepsilon_0 \varepsilon \varphi}{Ed}. \quad (7)$$

The number of dielectric layers in the piezoelectric material 100 having a thickness h is $$N = \kappa\frac{h}{d} \quad (8)$$

Where the coefficient $$\kappa = \frac{d}{d + d_{cond}}.$$

Now, combining Eq. (7) and Eq (8) expresses the piezoelectric charge constant in the following convenient form for appreciating several benefits of the invention:

$$d_{33} = -\kappa\frac{\varepsilon_0 \varepsilon h}{Ed^2}\varphi \quad (9)$$

As follows from Eq. (9), the piezoelectric charge constant of the piezoelectric material 100 is proportional to the thickness of the device h, to the contact potential $\phi$ and inversely proportional to both the stiffness E and to the square of the thickness of the insulating layer d. Thus, a dielectric insulating material, having a low stiffness, such as organic compounds and in particular polymeric materials, contribute to the desired outcome of a large piezoelectric effect. Further, it is desirable to make the insulating layer as thin as possible without exceeding its dielectric breakdown strength.

In an alternative embodiment of the invention, the first and second metal layers need not be a different composition or have a different work function when only the inverse piezoelectric effect is desired. If a voltage V is applied to the two leads of the device of FIG. 2, then the electrostatic force per surface area between the electrodes p will be $$p = \frac{1}{2}\varepsilon_0\varepsilon\left(\frac{V}{d}\right)^2. \tag{10}$$

This force is attractive independently on the sign of the potential V. The insulating layer is compressed under the applied force. Assuming that deformation of the insulating layer is elastic and small, using Eq. (4) we obtain $$\Delta d = -d\frac{\sigma}{E} = -\frac{1}{2}\frac{\varepsilon_0\varepsilon}{Ed}V^2. \tag{11}$$

Note, that the deformation is quadratic with the potential V. The minus sign in Eq. (11) corresponds to the compression. The total thickness change $\Delta h$ within N layers of the LMIM structure is $$\Delta h = N\Delta d = -\frac{N}{2}\frac{\varepsilon_0\varepsilon}{Ed}V^2. \tag{12}$$

Using Eq. (8) we have finally $$\Delta h = -\frac{\kappa h}{2}\frac{\varepsilon_0\varepsilon}{Ed^2}V^2. \tag{13}$$

This expression remains valid when the even and odd electrodes of the LMIM device are also made from different metals. For derivation of Eq. (13) we only assumed that the deformations are small and elastic. As follows from Eq. (13), the coupling between displacement and potential is quadratic. In contrast to this, this relation is linear in the classic inverse piezoelectric effect.

Noting that, $E_3 = V/d$ is the electric field within the dielectric layer we could rewrite Eq. (13) in the following form $$\frac{1}{h}\frac{\partial h}{\partial E_3} = \frac{\partial \ln(h)}{\partial E_3} = -\frac{\kappa\varepsilon_0\varepsilon}{E}E_3. \tag{14}$$

From Eq. (2) and Eq. (7) that describes the direct piezo effect follows $$\frac{\partial P_3}{\partial \sigma_3} = \frac{\partial \Delta q}{\partial \sigma_3} = -\frac{\kappa\varepsilon_0\varepsilon}{E}\frac{\varphi}{d}. \tag{15}$$

It is worth to note, that Eq. (14) coincides with the Eq. (15) if one will substitute $E_3$ instead of $\varphi/d$ in Eq. (15).

In contrast, for the classical piezoelectric phenomena (as was obtained by Lippmann in 1881 from general thermodynamic principles) the following equality holds:

$$\frac{\partial P_3}{\partial \sigma_3} = \frac{\partial \ln(h)}{\partial E_3} = d_{33}. \tag{16}$$

The aforementioned equations are now utilized to provide a theoretical example of an embodiment of the invention for a multilayered structure consisting from thin layers of gold and aluminum with an elastomer between them. The thickness h of the composite is assumed to be 1 mm and the thickness of metal and dielectric layers d=d (metal) is assumed to be 100 nm. The work function of gold and aluminum is 5.1 eV and 4.1 eV respectively. So, the contact potential between them is $\phi$=1 V. The Young module of the elastomer is 1.6 MPa. And the dielectric permittivity of the dielectric layers is about 3.5. Using Eq. (9) we could calculate the dielectric charge constant for this structure:

$$d_{33} = -1 \times 10^{-6} \text{ C/N} = -10^6 \text{ [pC/N]}$$

That number could be compared with the dielectric charge constant of the PZT5 ceramics: $d_{33} = 590 \times 10^{-12}$ C/N. Thus surprising, the direct piezoelectric effect for the theoretical structure is about 1700 times higher than in conventional piezoceramics.

The charge constant in the inverse piezoelectric effect for this structure depends on the applied voltage and is equal from Eq. (13) to $$d_{33}^{inv} = -3.5 \times 10^{-7} \text{ V[m/V]}$$

where V is the voltage applied to the two leads of the system (in volts). For V=10 Volts, this coefficient is 6000 times higher than $d_{33}$ of the PZT5, an unexpected result.

It will be appreciated by one of ordinary skill in the art, that numerous alternative embodiments of the invention exist that use different materials than those give in the above examples. Such alternatives include the variations in metals and metal pairs are from Au/Al. Accordingly, alternative metal pairs include any combination of Au, Pl, Co, Ni with Li, Al, Ca, Mg, Zn and the like. Generally, the thickness of the metal layers is at least 1 nm. Following are options for materials comprising the conductive couples:

Two metals, Metal and a doped in-organic semiconductor, Metal and doped organic semiconductor (conductive polymer), Metal and metal treated by a self assembled monolayer in order to change the working function, Metal with the same metal with a self assembled monolayer (Au with a self assembled monolayer of disulfide or thiloated hydrocarbon for example) as well as any possible combination of the possible conductive layers described above or other conductive materials.

It should be understood that such conductive layers can have substantially the same composition but differ in work function or Fermi level by doping or surface treatment. It also conceivable that the conductive layer can be formed by depositing a dielectric layer and then doping or otherwise treating one or both surfaces, by doping, ion implantation and the like so that the treated surface becomes conductive but is separated from the adjacent conductive layer by the other side or core of the deposited dielectric it was derived from.

Further, the dielectric material is preferably a polymer or lipids. More preferred polymers have a dielectric breakdown strength of greater than about $10^7$ V/m (or about 250 KV/in.).

Additionally the thickness of the dielectric or polymer layer is preferably from about 10 nm to about 100 nm.

The Dielectric layer should be elastic (the preferred young modulus is in the range of 1.6-500 MPa, however, the range can vary depending on the required application) such as: Polybutadiene elastomer, Polyurethane elastomer, PDMS elastomer, Rubbers, EPDM rubber (ethylene-propylene-diene-monomer-rubber), nitrile rubber, styrene-butadiene-styrene (SBS) rubber, PVDF (polyvinylidene fluoride), etc. And have the highest dielectric constant possible for example, PMMA/BaTiO composite (not very elastic but has very high dielectric constant), Lipids etc.

The inventive structure of FIG. 2, and related embodiments of the invention, may generally be fabricated by known methods of fabricating multilayer capacitors, but preferably by those that allow the controlled deposition of very thin layers of organic insulators. Such suitable methods are disclosed in U.S. Pat. Nos. 6,092,269 (to Yializis, et al., issued on Jul. 25, 2000), 5,736,448 (to Saia, et al., issued Apr. 7, 1998), which are incorporated herein by reference. Specific preferred polymers are those that are known for their facile deposition in the form of thin films, and include without limitation the polymers Parylene™, polymers formed from the monomers hexadioldiacrylate, triethylene glycol diacrylate, trimethylolpropaneethoxy-triacrylate, tetraethyleneglycol-diacry-acrylate, polyethylene glycol diacrylate and the like.

FIGS. 3-8 illustrate a method of fabricating piezoelectric material 100. In the series of FIG. 3-6, Fig. A in the series represents a mask used for either metal or dielectric layer deposition and/or patterning. FIG. B being a cross-sectional elevation through the structure at reference line B-B in the corresponding FIG. A. If the conductive materials are metal or inorganic semiconductors they can be deposited by Physical or Chemical Vapor Deposition. Organic dielectric materials can also be deposited from the vapor state, such as PARYLENE™ (poly para-xylylene and related analogs), but may also be deposited by spin coating, controlled dip or curtain coating from a dilute solution, as well as known methods of forming of transferring Langmuir-Blodgett films.

Thus, referring first to FIG. 3A, mask 301 has a generally central rectangular opening with a "finger" 301a intended for connection of a left electrode, shown as 140 in FIGS. 7B and 8B. Also shown in this FIG. is the outline 301b of an opposite "finger" in other masks used in the process, intended to define the structure for connecting the right electrode.

In FIG. 3B, a first metal layer 110 is deposited on substrate 124, which is optionally a dielectric layer that becomes a part of the device, or a thin sacrificial layer on a thicker rigid substrate, such as a silicon wafer so that the structure 100 can be released from the wafer. In the next step, the result of which is illustrated in FIG. 3C, dielectric material 115' is deposited to fill the region 301B that does not have a metal layer 110 due to the masking of 301.

It will be appreciated by those of ordinary skill in the art that this region of dielectric filler 115' can be formed by multiple methods, such as depositing a dielectric material through a mask, as well as coating an entire dielectric layer and then using photolithographic techniques to remove the excess dielectric material covering the first metal layer 110. Thus, any reference to a mask for patterning refers to coating through a mask, as well as coating a continuous layer, and then using a mask to pattern a photoresist layer. It will be appreciated that the contrast of the mask may be inverted for a negative versus positive.

In the next steps, illustrated by FIGS. 4A and 4B, the mask 302 is used to define or deposit a continuous dielectric layer 115 over both layer 110 and the dielectric portion 115'. It should be noted that in mask 302, both portion 301a and 301b are now open.

In the following step, shown in FIG. 5B a second metal layer 120 is deposited on the portion of the dielectric layer 115 corresponding to the opening in mask 303. It should be noted that as shown in FIG. 5A, for mask 303 the portion 301b is now open, whereas the portion 301a is closed. In the next step, the result of which is illustrated in FIG. 5C, dielectric material 125' is deposited to fill the region 301a that does not have a metal layer 120 due to the masking of 303.

In the next steps, illustrated by FIG. 6B, the mask 302 (shown again in FIG. 6A) is used to define or deposit a continuous second dielectric layer 125 over both the second metal layer 120 and the dielectric portion 125'. It should be noted that in mask 302, both portion 301a and 301b are now open. It should be appreciated that the same or a different dielectric material than that denominated 115 in FIG. 4B may be deposited as the dielectric layers 115', 125' and 125 in other steps.

Thus, the conclusion of the step described with respect to FIG. 6 the multiple layer structure has a central portion of what is essentially the fundamental repeat unit 105 having the layered structure of first a conductive layer 110, a first dielectric 115, a $2^{nd}$ conductive layer 120 and another second dielectric layer 125.

FIG. 7A is a cross-sectional elevation representing the structure formed from repeated applications of the steps in FIGS. 3-6, wherein multiples of repeat units 105 are deposited in sequence.

FIGS. 7B and 8A and B illustrate alternative methods of adding electrodes 140 and 150. ideally the previous process steps leave all the first conductive material layer 110 exposed on the left side of the structure in FIG. 7A, and all of the second conductive material layers 120 exposed on the right side. In such a case, known processes of metal deposition and filling can be used to connect all of the first conductive layers to each other as well as all the second conductive layers to each other, that is forming electrode 140 and 150 shown in FIG. 7B. Such metal filing or deposition of electrodes 140 and 150 can be carried out by Physical Vapor Deposition, Chemical Vapor Deposition or electroless plating of copper or nickel and the like.

However, depending on the nature of the dielectric deposition and/or planarization process it may be necessary to selectively remove or etch dielectric material from each side used to connect electrode 140 and 150. Both sides may be etched simultaneously or each side in a separate sub-step. Slow wet etching of organic dielectric layers is preferable so that metal or other conductive material layers 110 and 120 are not disturbed.

Preferably, the dielectric layers 125 and 125' are only partially removed in the "fingers" or regions defined by portion 301a and 301b of the masks 301, 302 and 303. The limited etching can be done by first masking the area not to be etched. Alternatively, depending on the selection of the dielectric layers 125 and the conductive layers 110 and 120, such selective etching may be carried out by reactive gas plasma or directed ion beam process.

In either case, this etching step leaves portion 110a of the first set of alternating metal layers protruding slighting from the left side. The etching step also leaves portion 120a of the second set of alternating metal layers protruding slightly from the left side. Accordingly, after such etching process, electrode 140 and 150 can be deposited by the previously described methods to form the piezoelectric material 100 shown in FIG. 8B.

Figure 9A:
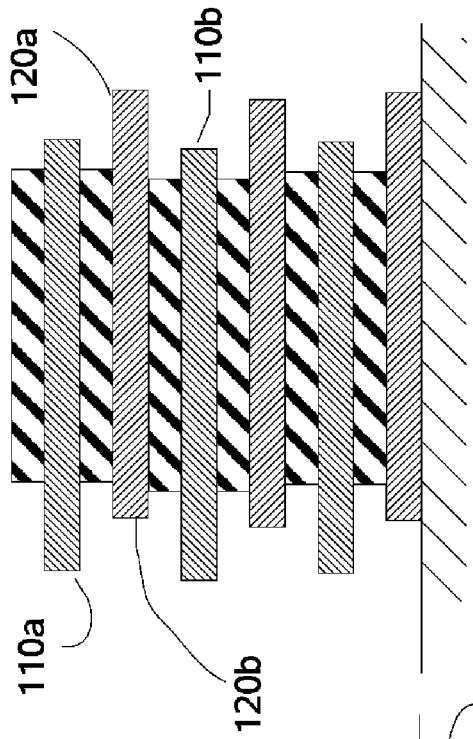
FIG. 9A-D represents cross-sectional elevations of steps in another alternative embodiment.
Figure 9B:
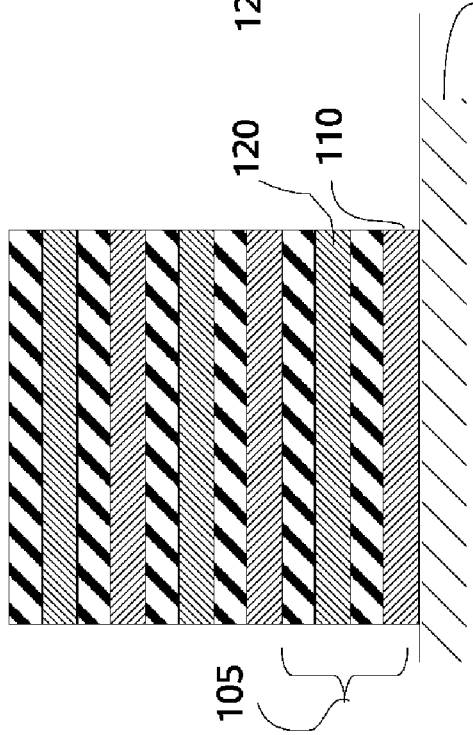

FIG. 9A-D illustrates an alternative method of forming piezoelectric material 100. Instead of depositing staggered layers by masking as shown in FIGS. 3-8, planar alternating layers of repeating structure 105 are formed, as shown in FIG. 9A. Then based the selective application of chemical etching agents that etch one conductive layer faster than the other, each of the left and right side are etched so that alternating conductive layers of each type protrude on opposite sides as shown in FIG. 9B. Also shown in this figure is that dielectric layers have been etched back more than the metal layers. The dielectric etching may be conducted before, after or simultaneously with the selective metal etching. Thus, in FIG. 9B, first conductive layer 110 have a left end portion 110a that protrudes to the left more than the left end portion 120b of the second conductive layers 120. In complementary contrast, on the right side second conductive layers 120 have right end portions 120a that protrudes to the right more than the right end portion 110b of the first conductive layer 110.

Figure 9C:
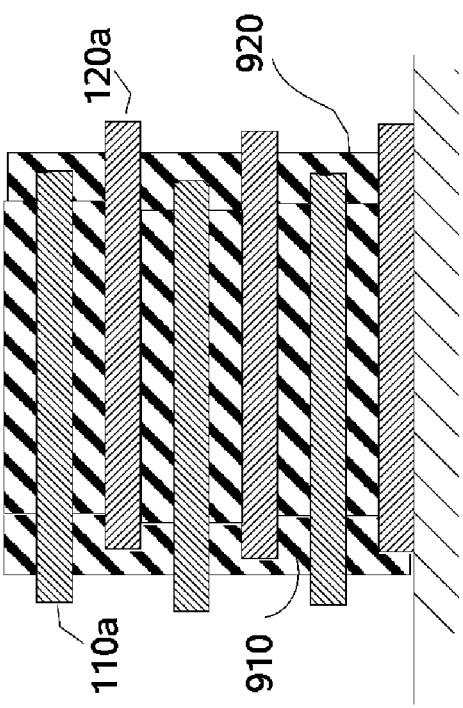
Figure 9D:
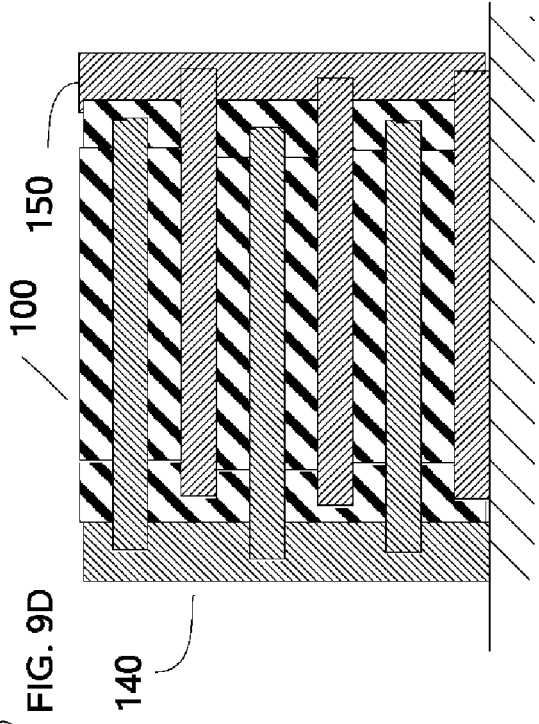

Next as shown in FIG. 9C, in one or more steps the left and right ends are at least partially coated with dielectric layers 910, on the left, and 920, on the right so that only protruding ends 110b and 120b are covered. Then, as shown in FIG. 9D, the left protruding ends 110a of the first conductive layers are coated with metal to form electrode 140, whereas the right protruding ends 120a of the second conductive layers 120 are coated with metal to form electrode 150, to piezoelectric material 100 to form a charge or current generating device.

The methods of FIGS. 7-9 can be formed by being deposited for example on a smooth silicon wafer by the following process. First, the silicon wafers are cleaned with UV ozone, plasma, or so-called Piranha solutions, and then preferably are annealed at 150 C for 5 h in vacuum, to achieve hydroxylated silicon wafers. Next, the polydimethylsiloxane (PDMS) film as the first dielectric layer is deposited by the direct spin coating of toluene solutions onto the hydroxylated silicon wafers Then, but prior to the deposition of a first conductive layer, such as gold (Au), the exposed PDMS surface is activated for increasing the adhesion to the Au by reactive ion etching (RIE) in oxygen for about 1-15 seconds. Next, the gold is deposited by chemical or physical vapor deposition. Preferably prior to the next PDMS spin-coating (on the Au layer), The Au layer is pre-treated with a solution containing a molecular species that is capable of forming a self assembled monolayer (SAM), such as alkanethiol inks. In particular, an Au layer modified by a thiolated monolayer will have a much lower working function than its natural work function.

Again, a second dielectric layer of PDMS is deposited by spin coating from a toluene solution. Again the PDMS is preferably activated to improve adhesion to the second conductive layer. Then, a second conductive layer of either copper (Cu) or silver (Ag) deposited by chemical or physical vapor deposition.

Preferably prior to the next PDMS spin-coating (on the Ag or Cu layer), this layer is pre-treated with a solution containing a molecular species that is capable of forming a self assembled monolayer (SAM), such as alkanethiol inks. Now that repeat unit 105 has been formed, the previous steps are repeated for achieving the desired number of repeat unit or total layers. In the next steps of the selective etching of the PDMS at each side and different metal a preferred method is to use a slow etching process for better control of the etching process. A PDMS dielectric layer can be etched with tetrabutylammonium fluoride ($C_{16}H_{36}FN$)+n-methyl-2-pyrrolidinone ($C_5H_9NO$)3:1. Au can be etched with aqua regia, but preferably hot sulfuric acid containing 4 g:2 g:10 ml—KI:$I_2$:$H_2O$ Hot, for example at about 70° C., for an etch rate of about 280 nm/min or with 9 g:1 g:50 ml—NaBr:$Br_2$:$H_2O$ (for an etch rate of about 400 nm/min.) Ag can be etched with 3:3:23:1 $H_3PO_4$:$HNO_3$:$CH_3COOH$:$H_2O$ (for an etch rate of about ~10 min/100A) and Cu can be etched with any of 30% FeCl3 saturated solution, 1:5—$H_2O$:$HNO_3$, $HNO_3$ concentrated and dilute, 1:1—NH4OH:$H_2O_2$, 1:20—$HNO_3$:$H_2O_2$, 4:1—$NH_3$:$H_2O_2$, 1:1:1—$H_3PO_4$:$HNO_3$:HAc, 5 ml:5 ml:4 g:1:90 ml—$HNO_3$:$H_2SO_4$:$CrO_3$:$NH_4Cl$:$H_2O$ as well as 4:1:5—HCL:$FeCl_3$:$H_2O$ However, depending on the ultimate fabrication process more preferred pairs of conductive materials used to achieve a greater difference in work function, might include Pt or Ge as a first conductive material (work function about 5.1-5.93 for Pt, and about 5 for Ge) and either at least one of AgOCs (having a work function of about 1) or semiconductors (p-doped) covered with a thin layer (n-doped) potentially having a work function of less than 1.

An alternative method is illustrate in FIGS. 10 and 11, wherein the alternating dielectric layers are first coated on a releasable substrate 126.

Although this description starts with the deposition of the first dielectric layer 115, it will be recognized that alternative sequences are possible so long as an exposed edge of other portion of the first conductive layer 110 and second conductive layer 120 are accessible for contacting electrodes, but isolated by the dielectric layers 115 and 125.

Thus, the first step in this embodiment is depositing the first dielectric layer 115 on substrate 126, as illustrated in FIG. 10A.

Next, referring to FIG. 10B the first conductive layer 110 is deposited in on the first dielectric layer 115.

Then, as shown in FIG. 10C, the second dielectric layer 125 is deposited to cover all but an edge portion 113 of the first conductive layer 110.

Figure 11A:
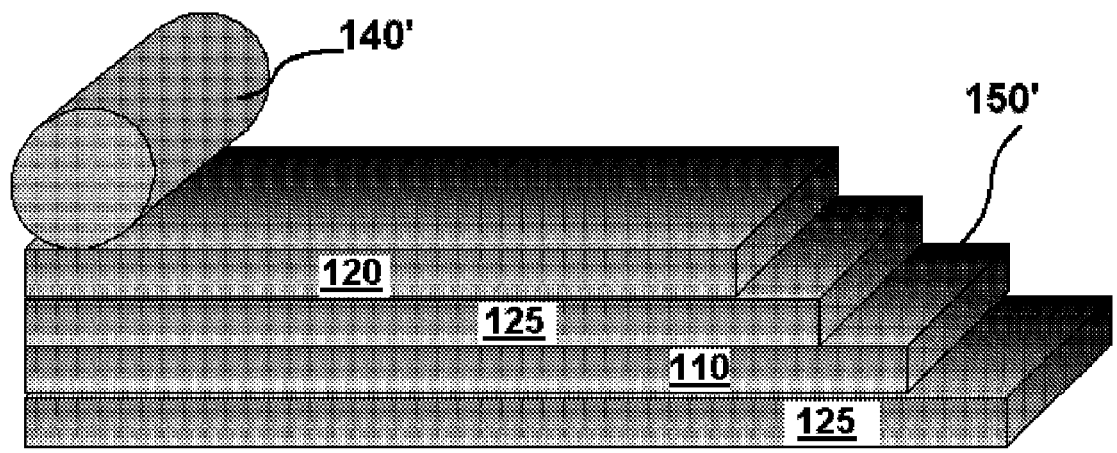
FIG. 11A is a perspective view of the layer shown in FIG. 10E being wrapped.
Figure 11B:
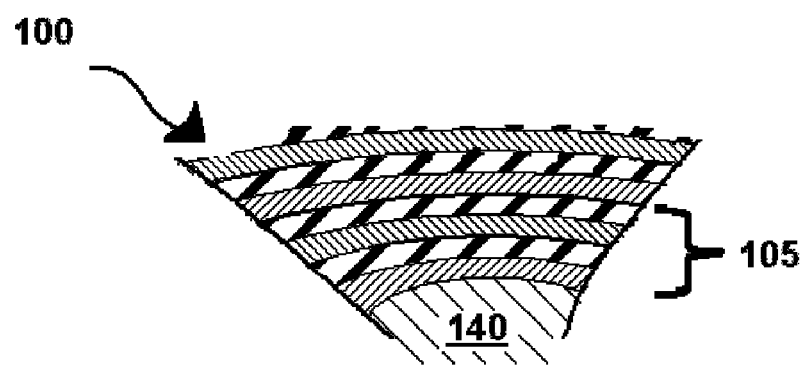
FIG. 11B is a corresponding cross-sectional elevation of one embodiment of a piezoelectric device after fabrication is complete.

Then, as shown in FIG. 10D, the second conductive layer 120 is deposited on the second dielectric layer 125. Next, the combination of layer 115, 110, 125 and 120 (which is repeat unit 105) is removed or released from substrate 126, so that is can be wrapped multiple times around a conductive mandrel 140', to created a laminated multilayer structure acts as on electrode connecting all of the second conductive layer 120. A partial cross-section of such as device is shown in FIG. 11B, with the wrapping shown in a perspective view in FIG. 11A.

Thus, after wrapping the exposed edge portion 113 of the first conductive layer is available to as electrode 150', or may have an electrode connected in electrical communication therewith.

While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

The invention claimed is:

1. A composition of matter
   a) a plurality of repeating thin film layers having in a repeating sequence the ordered structure of:
      i) a dielectric material,
      ii) a first conductive layer,
      iii) a dielectric material,
      iv) a second conductive layer, wherein one of the first and second conductive layers is a metal and the other of the first and second conductive layers is a semiconductor
   b) a first terminal connecting all the first conductive layers, c) a second terminal connecting all the second conductive layers, wherein the first and second conductive layers are electrically insolated by the dielectric material.

2. A composition of matter according to claim 1 wherein at least one of the dielectric materials is an organic material.

3. A composition of matter according to claim 2 wherein the organic material is polymeric.

4. A composition of matter according to claim 1 wherein the first and second conductive layer are metals and when the dielectric material layers have a thickness d and the electric field across the dielectric material layer is $(W1-W2)/(e*d)$, wherein e is the charge on an electron, W1 is the work function of the first metal and W2 is the work function of the second metal.

5. A composition of matter according to claim 1 wherein when the dielectric material have a thickness d and the electric field across the dielectric material layer is $(F1-F2)/(e*d)$, wherein e is the charge on the electron, F1 is the Fermi level of the first conductive material and F2 is the Fermi level of the second conductive material.

6. A composition of matter according to claim 1 wherein said dielectric materials are not the same.

7. A method of charging a battery implanted in a living organism;
   a) providing the piezoelectric device of claim 1,
   b) implanting the piezoelectric device so as to be exposed to pressure fluctuations arising from the organisms pulse and other mechanical forces caused by the activities of said organism,
   c) connecting the terminals of the piezoelectric device to an implanted battery.

8. A composition of matter according to claim 1 wherein both of the dielectric material disposed between the first and second conductive layers do not inherently exhibit piezoelectric properties.

9. A composition of matter according to claim 8 wherein the plurality of repeating thin film layers comprises at least 4 dielectric layers and 4 conductive layers, each conductive layer disposed between a pair of dielectric layers to form the repeating sequence.

10. A composition of matter according to claim 8 wherein the plurality of repeating thin film layers comprises at least 4 dielectric layers and 4 conductive layers, each conductive layer disposed between a pair of dielectric layers to form the repeating sequence.

11. A composition of matter according to claim 8 wherein the dielectric layer is an elastomer.

12. A composition of matter according to claim 8 wherein one conductive layer is gold and the other conductive layer is aluminum.

13. A composition of matter according to claim 8 wherein the dielectric material is an elastomer.

14. A composition of matter according to claim 8 wherein the dielectric material is an elastomer with Young's modulus of about 1.6 MPa.

15. A composition of matter according to claim 1 having a piezoelectric charge constant proportional to the thickness of the device h, to the contact potential $\phi$ and inversely proportional to both the stiffness E and to the square of the thickness of the insulating layer d.

16. A composition of matter according to claim 1 wherein the dielectric layers have a dielectric breakdown of about $10^7$ V/m.

17. A composition of matter according to claim 1 having a dielectric charge constant, $d_{33}$, of at least about $1\times10^{-6}$ C/N.

18. A composition of matter according to claim 15 wherein the dielectric layers have a dielectric breakdown of about $10^7$ V/m.

19. A composition of matter according to claim 1 wherein the dielectric layers have a dielectric breakdown of about $10^7$ V/m.

20. A composition of matter according to claim 1 having a dielectric charge constant, $d_{33}$, of at least about $1\times10^{-6}$ C/N.

* * * * *